United States Patent
Huang et al.

(10) Patent No.: US 10,050,081 B2
(45) Date of Patent: Aug. 14, 2018

(54) LIGHT-EMITTING DEVICE AND METHOD FOR MANUFACTURING THE SAME

(71) Applicant: Genesis Photonics Inc., Tainan (TW)

(72) Inventors: Tsung-Syun Huang, Tainan (TW);
Chih-Chung Kuo, Tainan (TW);
Jing-En Huang, Tainan (TW);
Shao-Ying Ting, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 15/135,584

(22) Filed: Apr. 22, 2016

(65) Prior Publication Data

US 2016/0343910 A1 Nov. 24, 2016

Related U.S. Application Data

(60) Provisional application No. 62/151,380, filed on Apr. 22, 2015, provisional application No. 62/192,054, filed on Jul. 13, 2015.

(51) Int. Cl.
*H01L 33/24* (2010.01)
*H01L 27/15* (2006.01)
*H01L 33/20* (2010.01)

(52) U.S. Cl.
CPC .......... *H01L 27/15* (2013.01); *H01L 27/153* (2013.01); *H01L 33/20* (2013.01); *H01L 2933/0016* (2013.01)

(58) Field of Classification Search
CPC ..................................................... H01L 27/153
USPC ........................................................... 257/90
See application file for complete search history.

(56) References Cited

U.S. PATENT DOCUMENTS

| | | | |
|---|---|---|---|
| 8,314,434 B2 * | 11/2012 | Lin | H01L 27/153 257/88 |
| 9,281,449 B2 * | 3/2016 | Kim | H01L 33/06 |
| 2013/0256712 A1 * | 10/2013 | Hwang | H01L 27/156 257/88 |

* cited by examiner

*Primary Examiner* — Chandra Chaudhari
(74) *Attorney, Agent, or Firm* — McClure, Qualey & Rodack, LLP

(57) ABSTRACT

A light-emitting device includes a substrate and a first light-emitting unit. The first light-emitting unit is disposed on the substrate, and includes a first semiconductor layer, a first light-emitting layer, and a second semiconductor layer. The first semiconductor layer is disposed on the substrate. The first light-emitting layer is disposed between the first semiconductor layer and the second semiconductor layer. The second semiconductor layer is disposed on the first light-emitting layer. The first semiconductor layer has a first sidewall and a second sidewall. A first angle is between the substrate and the first sidewall. A second angle is between the substrate and the second sidewall. The first angle is smaller than the second angle.

13 Claims, 22 Drawing Sheets

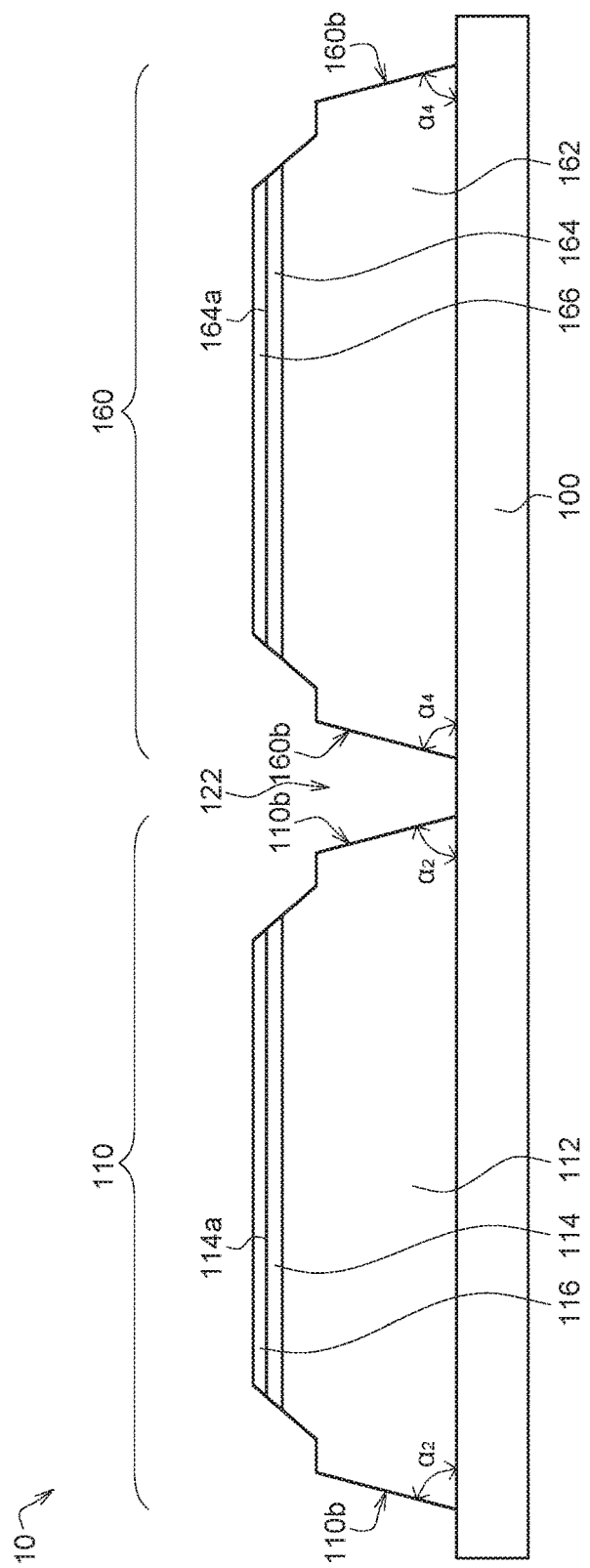

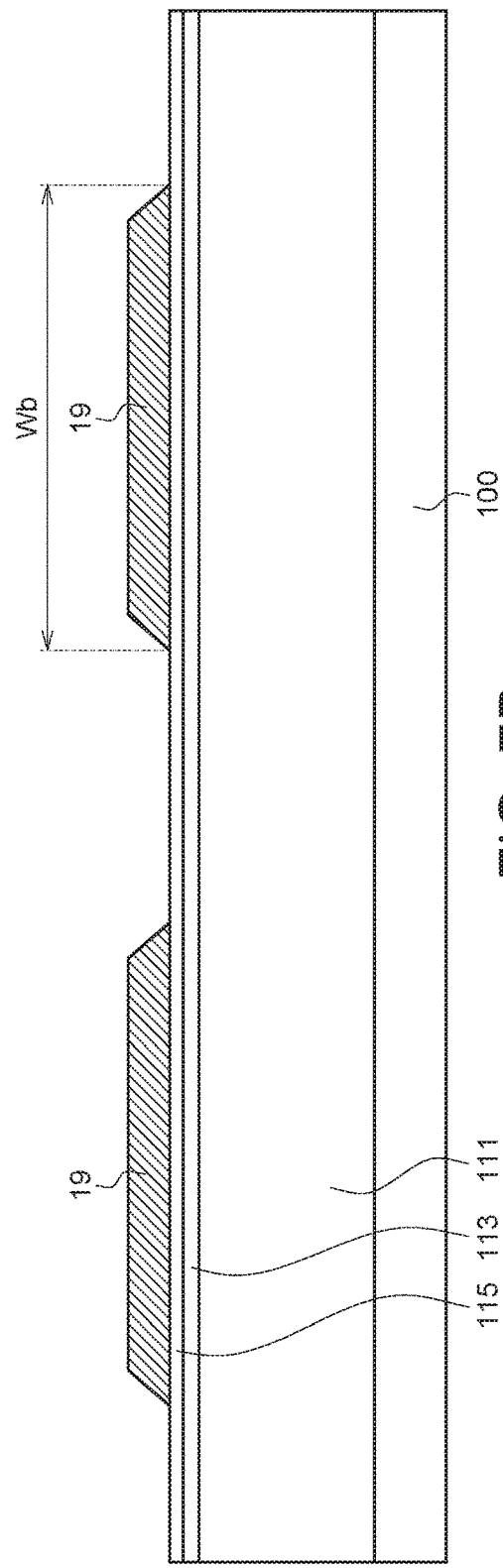

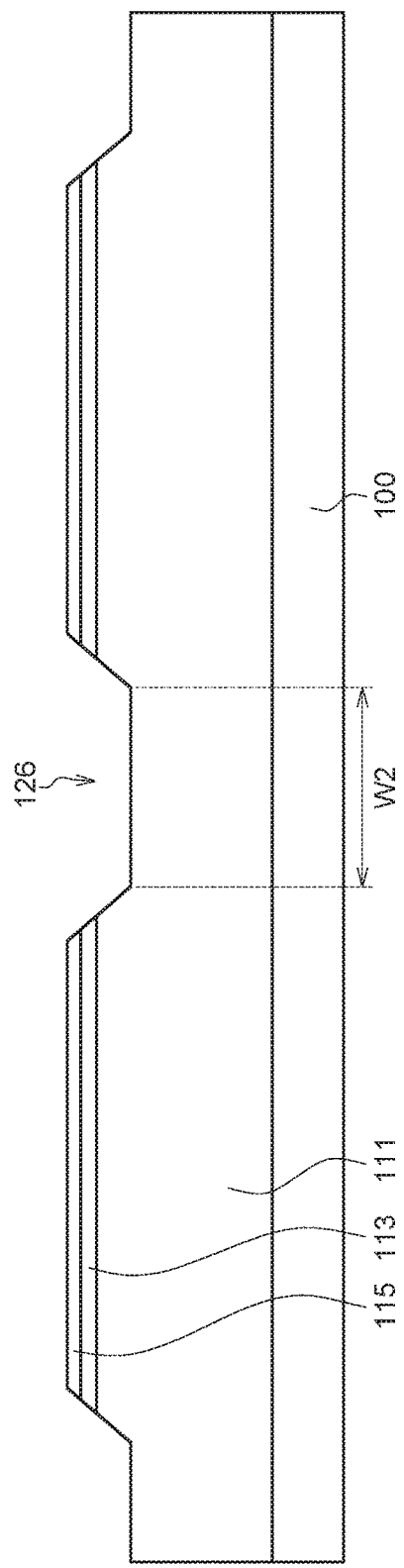

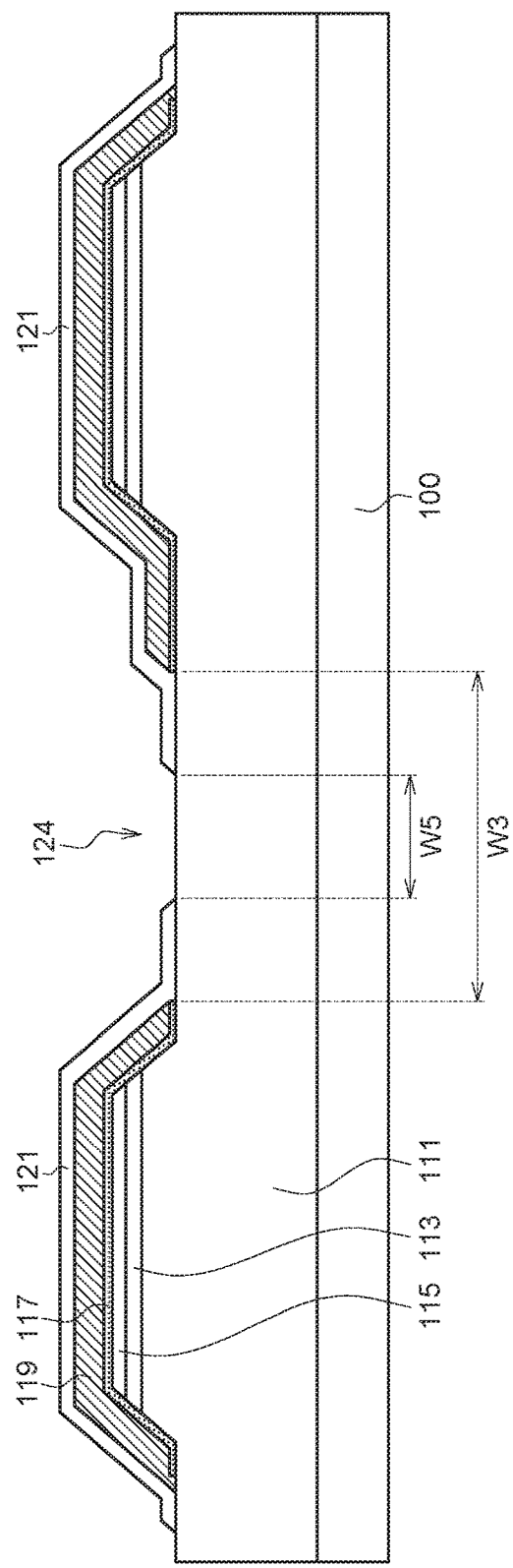

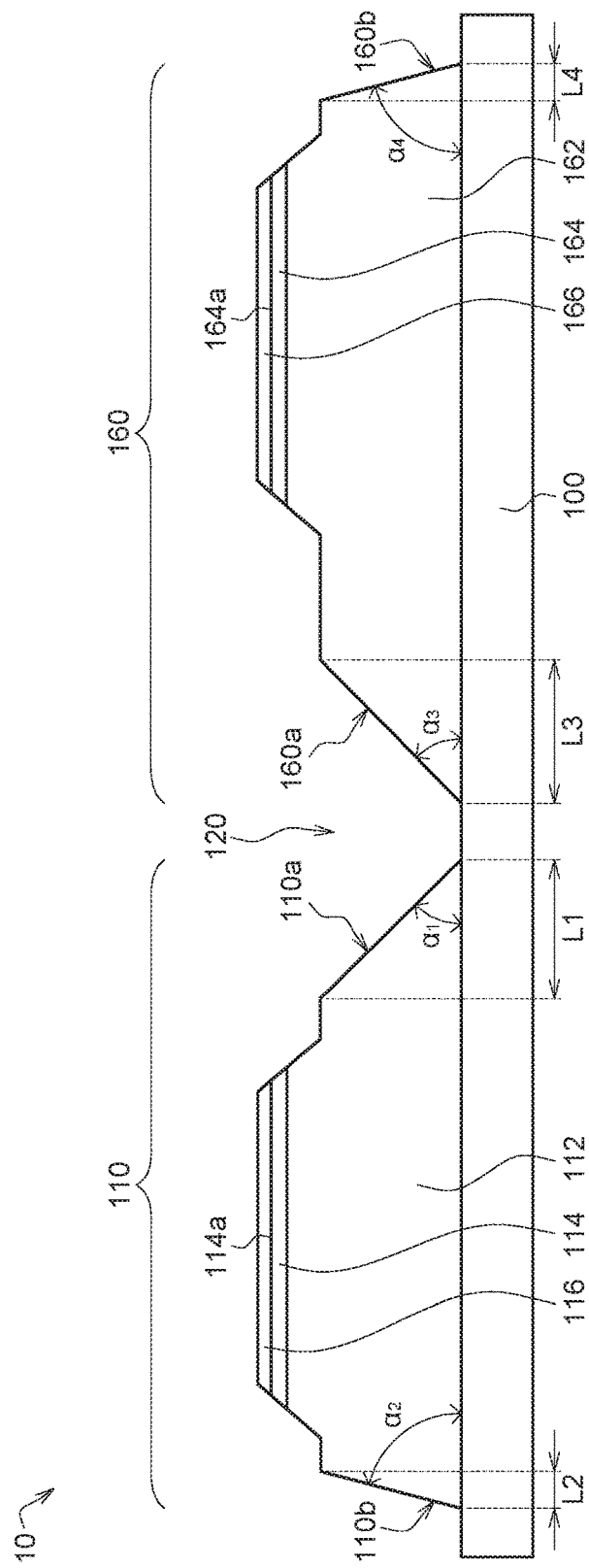

LIGHT-EMITTING DEVICE AND METHOD FOR MANUFACTURING THE SAME

This application claims the benefit of U.S. provisional application Ser. No. 62/151,380, filed Apr. 22, 2015 and U.S. provisional application Ser. No. 62/192,054, filed Jul. 13, 2015, the disclosure of which is incorporated by reference herein in its entirety.

BACKGROUND OF THE INVENTION

Field of the Invention

The invention relates to a light-emitting device and method for manufacturing the same, and more particularly to a light-emitting device capable of increasing the light-emitting area and method for manufacturing the same.

Description of the Related Art

In a light-emitting device, such as a high-voltage light-emitting device, a bridge circuit connecting two light-emitting units is generally needed to be formed on a slope structure to improve the adhesion capability of metal during evaporation process, and to avoid the disconnection of the metal line or the peeling of the metal during the lift-off process of the photoresist. In a conventional light-emitting device, the method of the slope structure is generally to form photoresist pattern on the semiconductor by using photolithography, and then to etch the semiconductor and the photoresist by using an Inductively Coupled Plasma (ICP) process and a Reactive-Ion Etching (RIE) process. However, during the etching process using the photoresist, it is apt to remove excessive amounts of the semiconductor material and light-emitting material, which results in the shrinkage of the light-emitting area and increases the production cost. Besides, in the conventional light-emitting device, due to poor capability of the bridge circuit adhering to the insulating layer, it is readily to cause voids or even defects formed in the bridge circuit during the process, and the electrical conductivity is further affected.

Therefore, so far providing a solution for increasing the light-emitting area and increasing the adhesion capability of the conductive layer is still in demand.

SUMMARY OF THE INVENTION

The invention provides a light-emitting device capable of increasing the light-emitting area and a method for manufacturing the same, to increase the light-emitting intensity and improve the performance of the chip.

According to one aspect of the present invention, a light-emitting device is provided. The light-emitting device includes a substrate and a first light-emitting unit. The first light-emitting unit is disposed on the substrate, and includes a first semiconductor layer, a first light-emitting layer, and a second semiconductor layer. The first semiconductor layer is disposed on the substrate. The first light-emitting layer is disposed between the first semiconductor layer and the second semiconductor layer. The second semiconductor layer is disposed on the first light-emitting layer. The first semiconductor layer has a first sidewall and a second sidewall. A first angle is between the substrate and the first sidewall. A second angle is between the substrate and the second sidewall. The first angle is smaller than the second angle.

According to one aspect of the present invention, a light-emitting device is provided. The light-emitting device includes a substrate and a first light-emitting unit. The first light-emitting unit is disposed on the substrate, and includes a first semiconductor layer, a first light-emitting layer, and a second semiconductor layer. The first semiconductor layer is disposed on the substrate. The first light-emitting layer is disposed between the first semiconductor layer and the second semiconductor layer. The second semiconductor layer is disposed on the first light-emitting layer. The first semiconductor layer has a first sidewall and a second sidewall. The first sidewall projected on the substrate has a first length. The second sidewall projected on the substrate has a second length. The first length is larger than the second length.

According to one aspect of the present invention, a method for manufacturing a light-emitting device is provided. The method includes forming a first type semiconductor layer, a light-emitting layer and a second type semiconductor layer on a substrate in sequence; forming a first patterned photoresist layer on the second type semiconductor layer; etching the second semiconductor layer, the light-emitting layer and a portion of the first type semiconductor layer to form an opening by using the first patterned photoresist layer as a mask, wherein the first type semiconductor layer exposed by the opening has a first width; forming a sacrifice layer covering the first type semiconductor layer and the second type semiconductor layer after removing the first patterned photoresist layer; forming a second patterned photoresist layer covering the sacrifice layer; patterning the sacrifice layer using the second patterned photoresist layer, wherein the first type semiconductor layer exposed by the sacrifice layer in the opening has a second width, and the second width is smaller than the first width; forming a third patterned photoresist layer covering the sacrifice layer and a portion of the first type semiconductor layer, wherein the first type semiconductor layer exposed by the third patterned photoresist layer in the opening has a third width, and the third width is smaller than the second width; etching the first type semiconductor layer by using the third patterned layer and the sacrifice layer as a mask; removing the sacrifice layer and the third patterned photoresist layer; forming an insulating layer covering a portion of the first semiconductor layer in the opening, and forming a conductive layer covering the insulating layer in the opening.

The above and other aspects of the invention will become better understood with regard to the following detailed description of the preferred embodiment (s). The following description is made with reference to the accompanying drawings.

BRIEF DESCRIPTION OF THE DRAWINGS

FIG. 2B shows a cross-sectional view of a light-emitting device along the section line 2B-2B' in FIG. 1 of an embodiment of the invention.

DETAILED DESCRIPTION OF THE INVENTION

Figure 1:
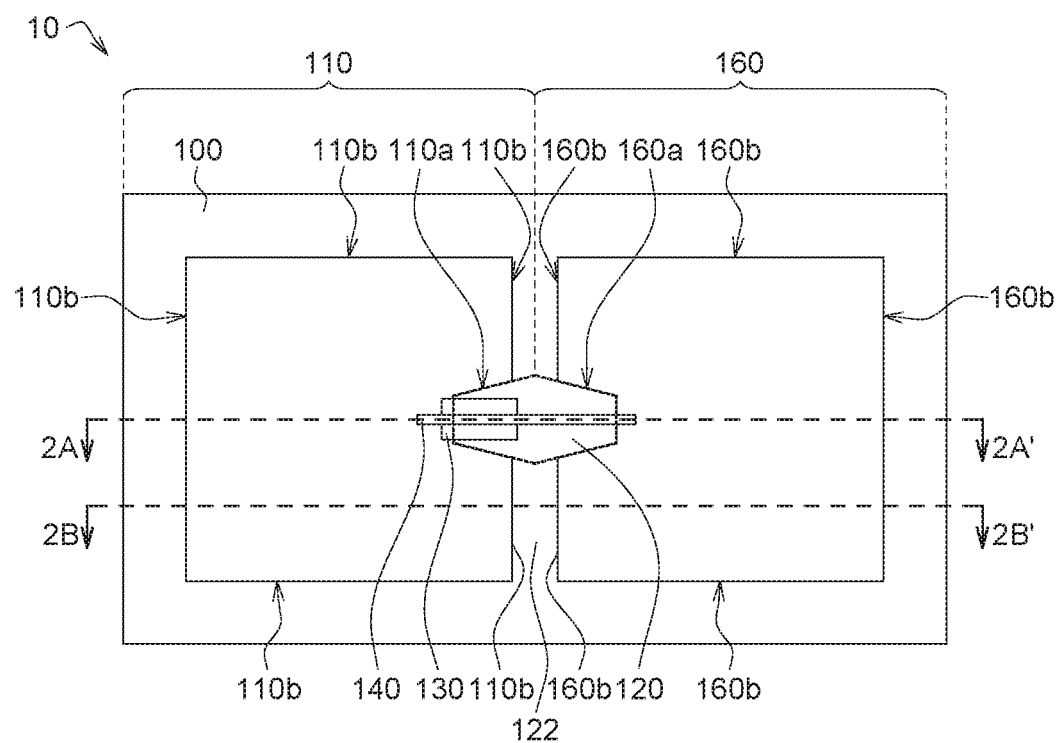
FIG. 1 shows a top view of a light-emitting device according to an embodiment of the invention.
Figure 2A:
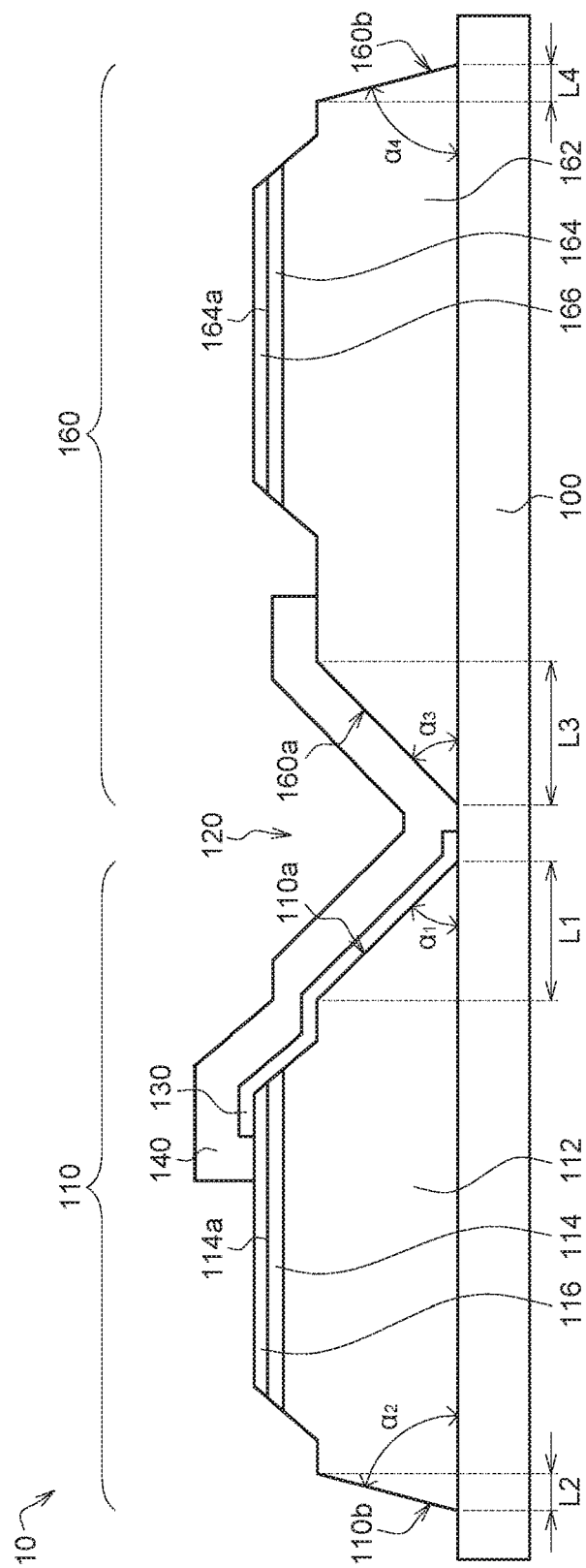
FIG. 2A shows a cross-sectional view of a light-emitting device along the section line 2A-2A' in FIG. 1 of an embodiment of the invention.
Figure 2C:
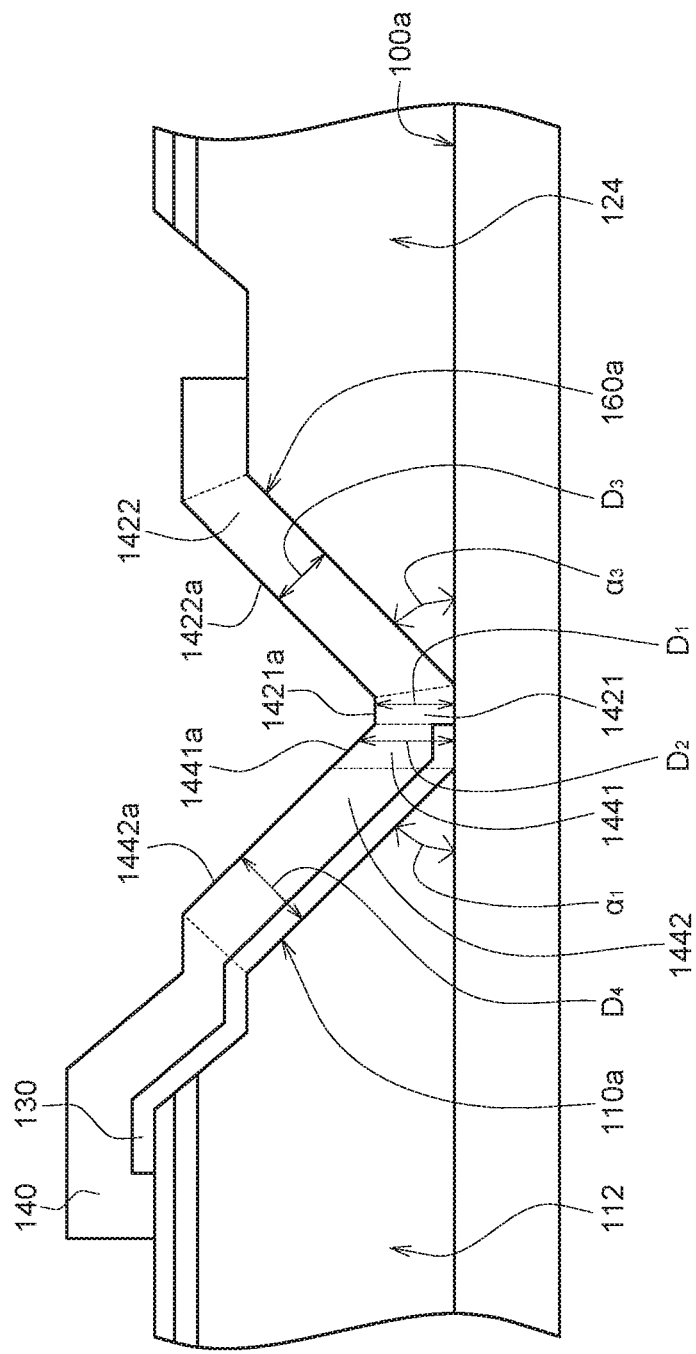
FIG. 2C shows a partially enlarged cross-sectional view of a light-emitting device along the section line 2A-2A' in FIG. 1 of an embodiment of the invention.

FIG. 1 shows a top view of a light-emitting device 10 according to an embodiment of the invention. FIG. 2A shows a cross-sectional view of a light-emitting device 10 along the section line 2A-2A' in FIG. 1 of an embodiment of the invention. FIG. 2B shows a cross-sectional view of a light-emitting device 10 along the section line 2B-2B' in FIG. 1 of an embodiment of the invention. FIG. 2C shows a partially enlarged cross-sectional view of a light-emitting device 10 along the section line 2A-2A' in FIG. 1 of an embodiment of the invention.

Referring to FIGS. 1, 2A and 2B in the same time, the light-emitting device 10 includes a substrate 100, a first light-emitting unit 110, a first recess 120, an insulating layer 130 and a conductive layer 140.

The substrate 100 can be an insulating substrate, such as a sapphire substrate.

The first light-emitting unit 110 is disposed on the substrate 100. The first light-emitting unit 110 includes a first semiconductor layer 112, a first light-emitting layer 114 and a second semiconductor layer 116. The first semiconductor layer 112 is disposed on the substrate 100. The first light-emitting layer 114 is disposed between the first semiconductor layer 112 and the second semiconductor layer 116.

For example, the first semiconductor layer 112 is, an n-type semiconductor layer, and the second semiconductor layer 116 is a p-type semiconductor layer. Or, the first semiconductor layer 112 is a p-type semiconductor layer, and the second semiconductor layer 116 is an n-type semiconductor layer. In respect of materials, the p-type semiconductor layer, for example, is a gallium nitride (GaN) based semiconductor layer doped with magnesium (Mg), and the n-type semiconductor layer, for example, is a GaN based semiconductor layer doped with silicon (Si).

The first light-emitting layer 114 can be a structure of $In_xAl_yGa_{1-x-y}N$ ($0 \leq x$, $0 \leq y$, $x+y \leq 1$), and can be a single layer or multilayer structure.

The first recess 120 penetrates through the first semiconductor layer 112, and has a first sidewall 110a. The first sidewall 110a is defined by the first semiconductor layer 112. That is, the first semiconductor layer 112 has the first sidewall 110a.

The insulating layer 130 covers the first sidewall 110a of the first semiconductor layer 112, the first semiconductor layer 112, a side wall of the second semiconductor layer 116, a sidewall of the first light-emitting layer 114, the second semiconductor layer 116 and the substrate 100. The first sidewall 110a is defined by the first semiconductor layer 112. The material of the insulating layer 130 is, for example, $SiO_2$, $TiO_2$, or other oxide insulating materials.

The conductive layer 140 connects the first light-emitting unit 110 and the second light-emitting unit 160. The material of the conductive layer 140 can be metal. The conductive layer 140 is formed of gold (Au), aluminum (Al), chromium (Cr), platinum (Pt), titanium (Ti), nickel (Ni), indium tin oxide (ITO), or other conductive materials, for example. The conductive layer 140 can be a single layer or multilayer structure. For example, the conductive layer 140 can be a multilayer structure of Cr/Al/Ti/Pt/Au, a multilayer structure of Cr/Al/Ti/Pt/Ti/Pt/Au, or a structure having partially periodically repeated metals. Or, the outermost layer of the multilayer structure is formed of the element excluding Au, such as Cr, Pt, Ti, Ni, Al. In addition, the method for forming the conductive layer 140 with the multilayer structure can be formed of one or more ways of coating methods. For example, the Cr/Al/Ti layer is firstly formed by sputtering, and then the Ti/Pt/Au layer is formed by e-beam gun.

The second light-emitting unit 160 can be disposed on the substrate 100, and includes a third semiconductor layer 162, a second light-emitting layer 164, and a fourth semiconductor layer 166. The third semiconductor layer 162 is disposed on the substrate 100. The second light-emitting layer 164 is disposed between the third semiconductor layer 162 and the fourth semiconductor layer 166. The materials of the third semiconductor layer 162, the fourth semiconductor layer 166 and the second light-emitting layer 164 are respectively similar to the materials of the first semiconductor layer 112, the second semiconductor layer 116 and the first light-emitting layer 114 as described above, and not repeated here.

The first light-emitting unit 110 has a second sidewall 110b. The second sidewall 110b is defined by the first semiconductor layer 112. That is, the first semiconductor layer 112 has a second sidewall 110b. Referring to FIG. 1, the first sidewall 110a and the second sidewall 110b are connected to each other. The second sidewall 110b can be a sidewall of the first semiconductor layer 112 out of the first recess 120.

The first recess 120 further penetrates through the third semiconductor layer 162 and has a third sidewall 160a. The third sidewall 160a is defined by the third semiconductor layer 162. That is, the third semiconductor layer 162 has a third sidewall 160a. The conductive layer 140 connects the first light-emitting unit 110 and the second light-emitting unit 160 through the first recess 120. The first sidewall 110a and the third sidewall 160a are the two opposite sidewalls in the first recess 120. The conductive layer 140 in the first recess 120 electrically connects the second semiconductor layer 116 and the third semiconductor layer 162 through the first sidewall 110a and the third sidewall 160a.

The second light-emitting unit 160 has a fourth sidewall 160b. The fourth sidewall 160b is defined by the third semiconductor layer 162. That is, the third semiconductor layer 162 has a fourth sidewall 160b. Referring to FIG. 1, the third sidewall 160a and the fourth sidewall 160b are connected to each other. The fourth sidewall 160b can be a sidewall of the third semiconductor layer 162 out of the first recess 120.

Referring to FIG. 2A, a first angle $\alpha_1$ in the first semiconductor layer 112 is included between the first sidewall 110a and the substrate 100. A second angle $\alpha_2$ in the first semiconductor layer 112 is included between the second sidewall 110b and the substrate 100. The first angle $\alpha_1$ is smaller than the second angle $\alpha_2$. For example, the first angle $\alpha_1$ is smaller than 70 degrees, and the second angle $\alpha_2$ is larger than 70 degrees. Or, the first angle $\alpha_1$ is smaller than 50 degrees, and the second angle $\alpha_2$ is larger than 50 degrees.

A third angle $\alpha_3$ in the third semiconductor layer 162 is included between the third sidewall 160a and the substrate 100. A fourth angle $\alpha_4$ in the third semiconductor layer 162 is included between the fourth sidewall 160b and the substrate 100. The third angle $\alpha_3$ is smaller than the fourth angle $\alpha_4$. For example, the third angle $\alpha_3$ is smaller than 70 degrees, and the fourth angle $\alpha_4$ is larger than 70 degrees. Or, the third angle $\alpha_3$ is smaller than 50 degrees, and the fourth angle $\alpha_4$ is larger than 50 degrees.

In one embodiment, the first angle $\alpha_1$, the second angle $\alpha_2$, the third angle $\alpha_3$, and the fourth angle $\alpha_4$ can be an acute angle. The first angle $\alpha_1$ and the third angle $\alpha_3$ can be an angle ranged from 20 degrees to 70 degrees. Preferably, the first angle $\alpha_1$ and the third angle $\alpha_3$ range from 30 degrees to 50 degrees.

In the present embodiment, since the first angle $\alpha_1$ or the third angle $\alpha_3$ is smaller than 70 degrees, the conductive layer 140 is not peeled off easily by the gravity and has a better adhesion capability compared to the comparative embodiment having an angle larger than 70 degrees which is included between the second sidewall and the substrate in the first semiconductor layer or between the fourth sidewall and the substrate in the third semiconductor layer.

In one embodiment, a first length $L_1$ of the first sidewall 110a projected to the substrate 100 is larger than a second length $L_2$ of the second sidewall 110b projected to the substrate 100. A third length $L_3$ of the third sidewall 160a projected to the substrate 100 is larger than a fourth length $L_4$ of the fourth sidewall 160b projected to the substrate 100.

In the present embodiment, since the first angle $\alpha_1$ is smaller than the second angle $\alpha_2$ and the first length $L_1$ is larger than the second length $L_2$, the first light-emitting unit 110 of the present invention maintains a larger area for an upper surface 114a of the first light-emitting layer 114 and has a larger light-emitting area compared to the comparative embodiment that the first angle is similar to the second angle and the first length is similar to the second length.

Referring to FIG. 2B, a second recess 122 is between the first light-emitting unit 110 and the second light-emitting unit 160. Since the conductive layer is not necessary to be formed on the second sidewall 110b and the fourth sidewall 160b, the second angle $\alpha_2$ in the third semiconductor layer 162 formed between the second sidewall 110b and the substrate 100 can be larger than 50 degrees or larger than 70 degrees, and the fourth angle $\alpha_4$ in the third semiconductor layer 162 formed between the fourth sidewall 160b and the substrate 100 can be larger than 50 degrees or larger than 70 degrees. Therefore, the first light-emitting unit 110 of the present invention maintains a larger area for an upper surface 114a of the first light-emitting layer 114 and has a larger light-emitting area compared to the comparative embodiment that the second angle or the fourth angle is smaller than 70 degrees.

Referring to FIG. 2C, in the light-emitting device 10, the conductive layer 140 includes a first connecting portion 1421, a second connecting portion 1422, a first body portion 1441 and a second body portion 1442. The first connecting portion 1421 is directly formed on the upper surface 100a of the substrate 100, and the first body portion 1441 is formed on the insulating layer 130 which is disposed on the upper surface 100a of the substrate 100. The second connecting portion 1422 is formed on the third sidewall 160a, and the second body portion 1442 is formed on the insulating layer 130 which is disposed on the first sidewall 110a.

A first distance D1 between the upper surface 1421a of the first connecting portion 1421 and the upper surface 100a of the substrate 100 can range from 0.1 µm to 10 µm. Preferably, the first distance D1 ranges from 0.5 µm to 5 µm. A second distance D2 is between the outer surface 1441a of the first body portion 1441 and the upper surface 100a of the substrate 100. The first distance D1 is smaller than the second distance D2. The second distance D2 can range from 0.1 µm to 10 µm. Preferably, the second distance D2 ranges from 0.5 µm to 5 µm.

A third distance D3 between the outer surface 1422a of the second connecting portion 1422 and the third sidewall 160a ranges from 0.1 µm to 10 µm. Preferably, the third distance D3 ranges from 0.3 µm to 3 µm. The third distance D3 is smaller than or equal to the first distance D1. A fourth distance D4 between the outer surface 1442a of the second body portion 1442 and the first sidewall 110a ranges from 0.1 µm to 10 µm. Preferably, the fourth distance D4 ranges from 0.3 µm to 3 µm. The fourth distance D4 is smaller than or equal to the second distance D2. The third distance D3 is smaller than the fourth distance D4.

In the present embodiment, since the first distance D1 is smaller than the second distance D2 and the third distance D3 is smaller than the fourth distance D4, the conductive layer 140 is directly in contact with the upper surface 100a of the substrate 100 and the third sidewall 160a. The adhesion capability between the conductive layer 140 and the substrate 100 or the adhesion capability between the conductive layer 140 and the third sidewall 160a is better than the adhesion capability between the conductive layer 140 and the insulating layer 130. Therefore, the conductive layer 140 of the present embodiment can have a better adhesion capability and is not peeled off easily, the holes is not produced easily in the conductive layer 140, and the electrical conductivity can further be improved in comparison with the conventional light-emitting device.

FIGS. 3-14 show a manufacturing process diagram of a light-emitting device 10 of FIG. 1.

Figure 3:
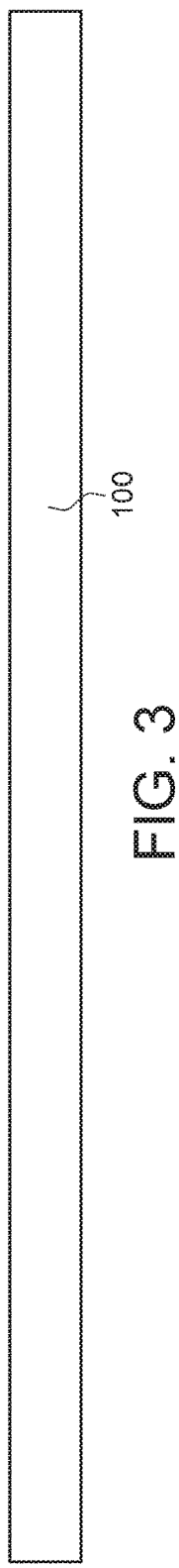
FIGS. 3-14 show a manufacturing process diagram of a light-emitting device according to an embodiment of the invention.

As shown in FIG. 3, a substrate 100 is formed. The substrate 100 is, for example, a sapphire substrate.

Figure 4:
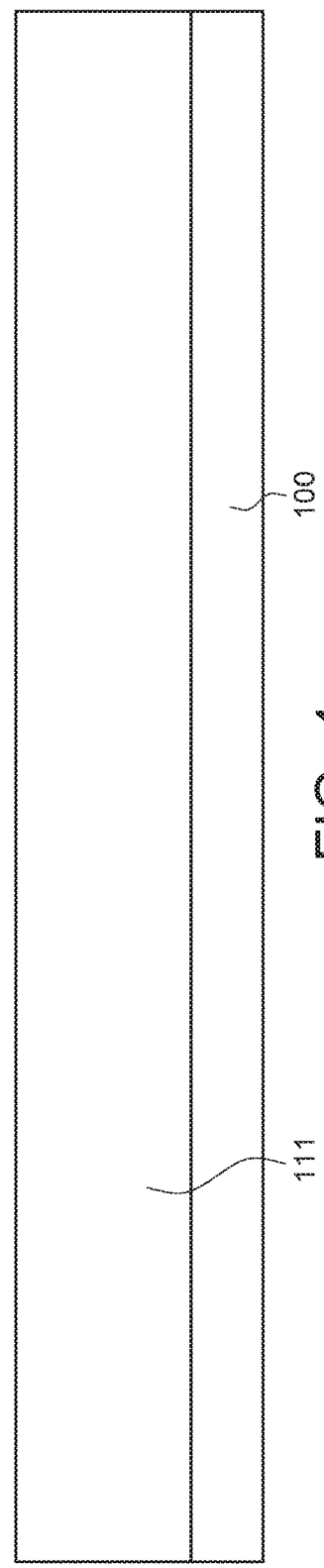

As shown in FIG. 4, a first type semiconductor layer 111 is formed on the substrate 100. The first type semiconductor layer 111 is, for example, an n-type semiconductor layer or a p-type semiconductor layer. In respect of materials, the p-type semiconductor layer is, for example, a GaN based semiconductor layer doped with beryllium (Be), zinc (Zn), manganese (Mn), chromium (Cr), or magnesium (Mg) . . . etc. The n-type semiconductor layer is, for example, a GaN based semiconductor layer doped with silicon (Si), germanium (Ge), stannum (Sn), sulfur (S), oxygen(O), titanium (Ti) or zirconium (Zr) . . . etc.

Figure 5:
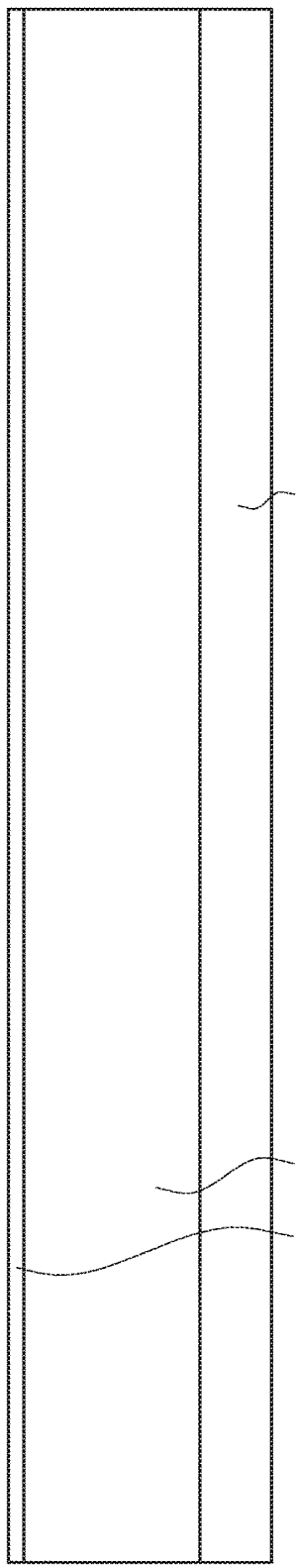

As shown in FIG. 5, a light-emitting layer 113 is formed on the first type semiconductor layer 111. The light-emitting layer 113 is, for example, a structure of $In_xAl_yGa_{1-x-y}N$ ($0 \leq x$, $0 \leq y$, $x+y \leq 1$), and can be a single layer or multilayer structure.

Figure 6:
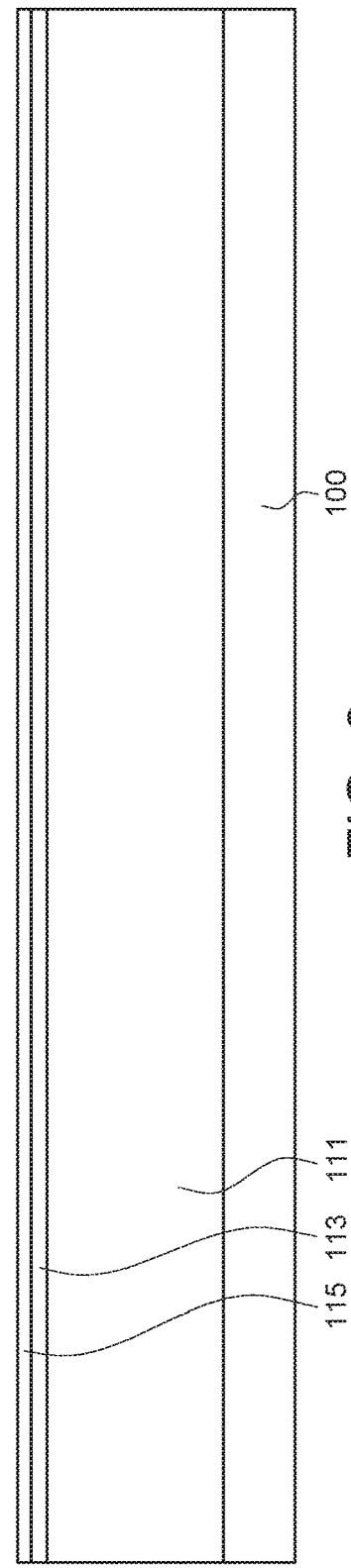

As shown in FIG. 6, a second type semiconductor layer 115 is formed on the light-emitting layer 113. The second type semiconductor layer 115 has an opposite conductivity type to the first type semiconductor layer 111. For example, when the first type semiconductor layer 113 is an n-type semiconductor layer, the second type semiconductor layer 115 is a p-type semiconductor layer. Or, when the first type semiconductor layer 113 is a p-type semiconductor layer, the second type semiconductor layer 115 is an n-type semiconductor layer.

FIGS. 7A, 8A, 9A, 10A, 11A, 12A, 13A show a cross-sectional view of a region for forming the conductive layer. For example, the cross-sectional view of the region for forming the conductive layer corresponds to the cross-sectional view along the section line 2A-2A' in FIG. 1. FIGS. 7B, 8B, 9B, 10B, 11B, 12B, 13B show a cross-sectional view of a region without forming the conductive layer. For example, the cross-sectional view of the region without forming the conductive layer corresponds to the cross-sectional view along the section line 2B-2B' in FIG. 1.

Figure 7A:
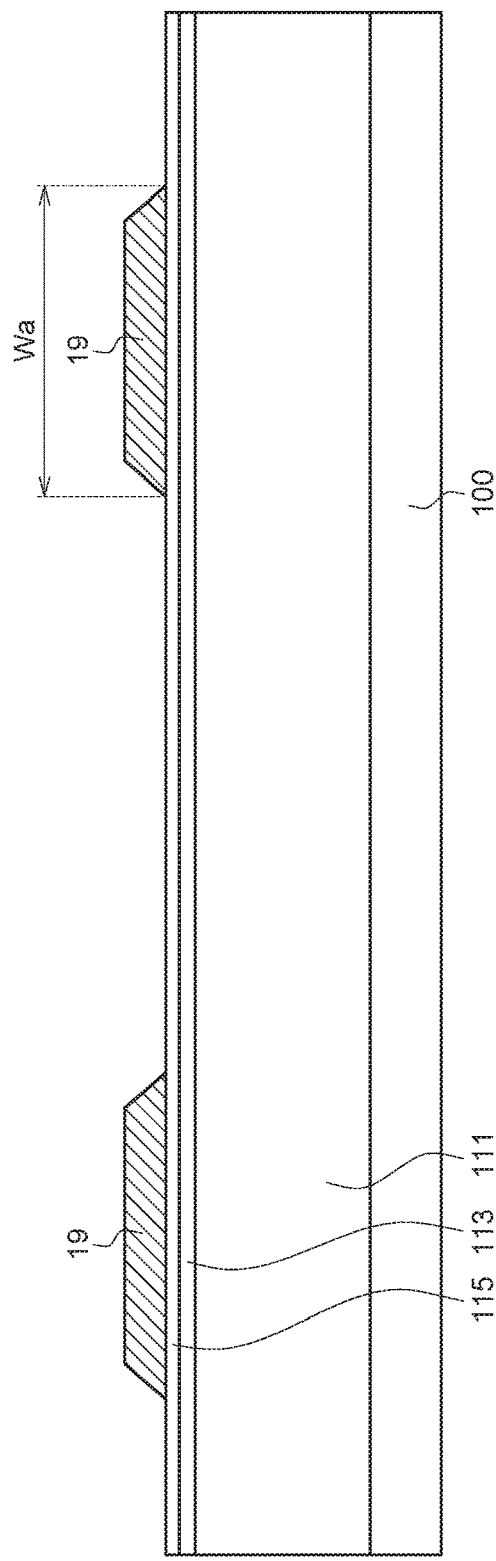

As shown in FIGS. 7A and 7B, a first photoresist layer 19 is formed on the second type semiconductor layer 115. Then, the first photoresist layer 19 is patterned to form the first patterned photoresist layer 19 on the second type semiconductor layer 115, and a portion of the second type semiconductor layer 115 is exposed, wherein the patterned first photoresist layer 19 has a width $W_a$ and a width $W_b$. The width $W_a$ is smaller than the width $W_b$. The width $W_a$ corresponds to the region for forming the conductive layer (as shown in FIG. 7A), and the width $W_b$ corresponds to the region without forming the conductive layer (as shown in FIG. 7B). The first photoresist layer 19 can be formed by spin coating. The first photoresist layer 19 is, for example, a polymer.

Figure 8A:
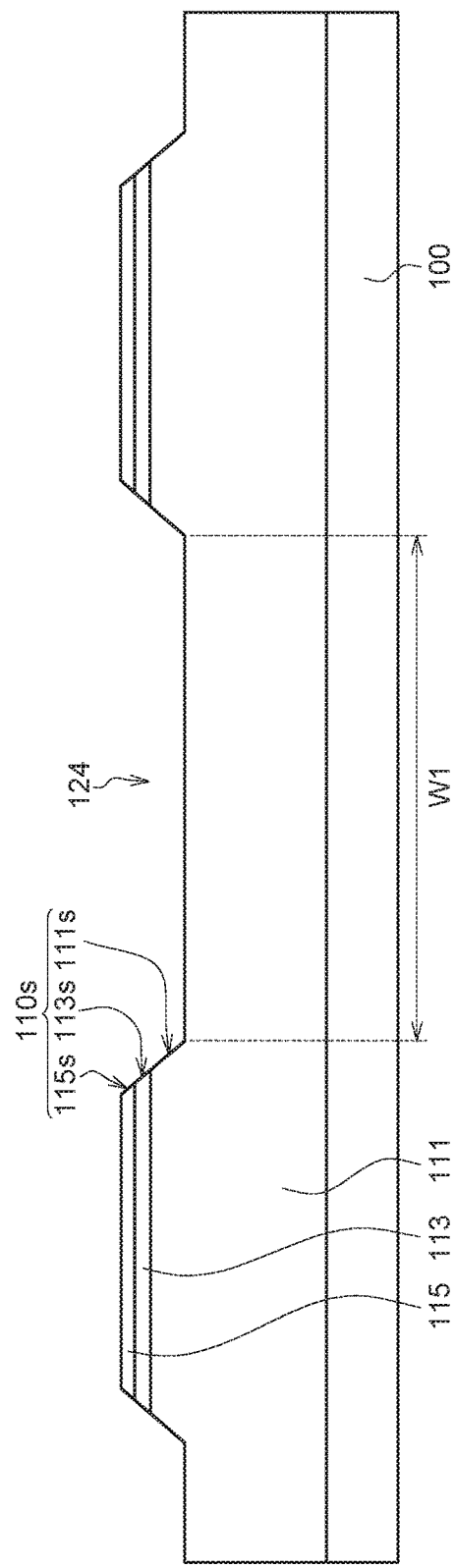

As shown in FIGS. 8A and 8B, the second type semiconductor layer 115, the light-emitting layer 113 and a portion of the first type semiconductor layer 111 are etched by using the first photoresist layer 19 as a mask, so that a first opening 124 and a second opening 126 are formed on the second type semiconductor layer 115 and the light-emitting layer 113. The first type semiconductor layer 111 and a side surface 110s are exposed from the first opening 124 and the second opening 126, wherein the side surface 110s is defined by a side surface 111s of the first type semiconductor layer 111, a side surface 115s of the second type semiconductor layer 115 and a side surface 113s of the light-emitting layer 113 together. A width W1 of the first opening 124 projected on the substrate 100 is larger than a width W2 of the second opening 126 projected on the substrate 100. The first opening 124 corresponds to a region for forming the conductive layer (as shown in FIG. 8A), and the second opening 126 corresponds to a region without forming the conductive layer (as shown in FIG. 8A). The first opening 124 and the second opening 126 are formed by the dry etching. The dry etching is, for example, the Inductively Coupled Plasma method.

Figure 9A:
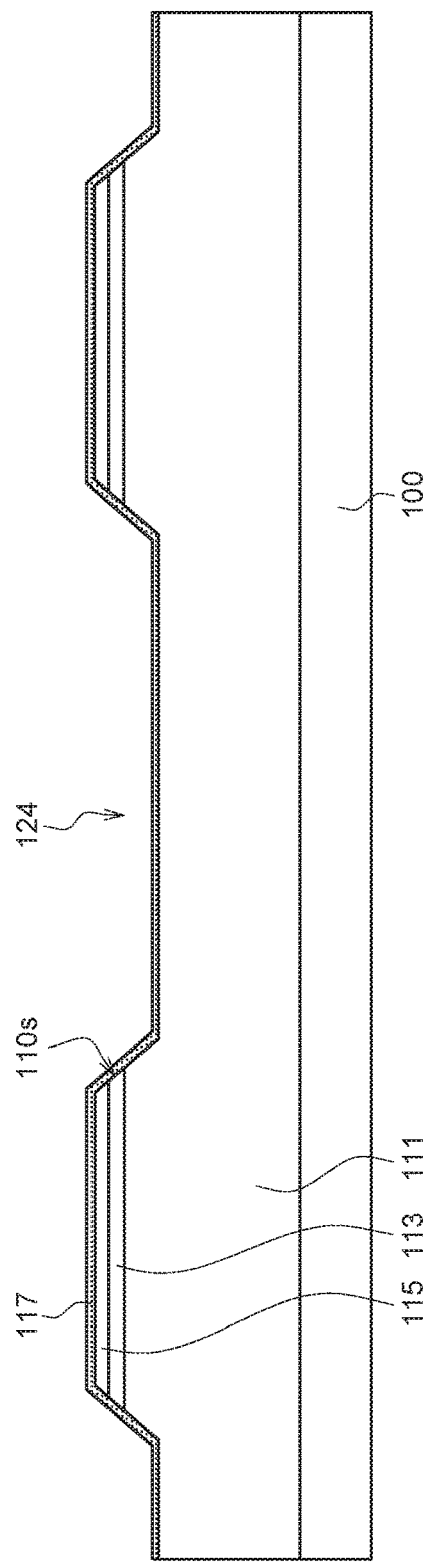
Figure 9B:
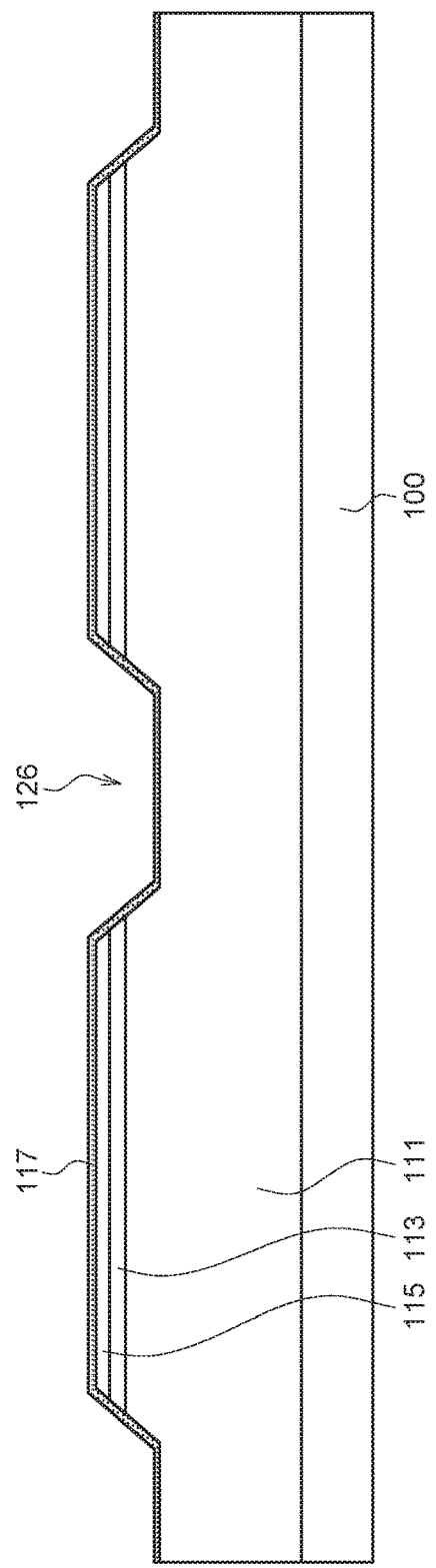

As shown in FIGS. 9A and 9B, a sacrifice layer 117 covering the second type semiconductor layer 115, the side surface 110a and the first type semiconductor layer 111 is formed after removing the first patterned photoresist layer 19. The sacrifice layer 117 can include an oxide film or a nitride film.

Figure 10A:
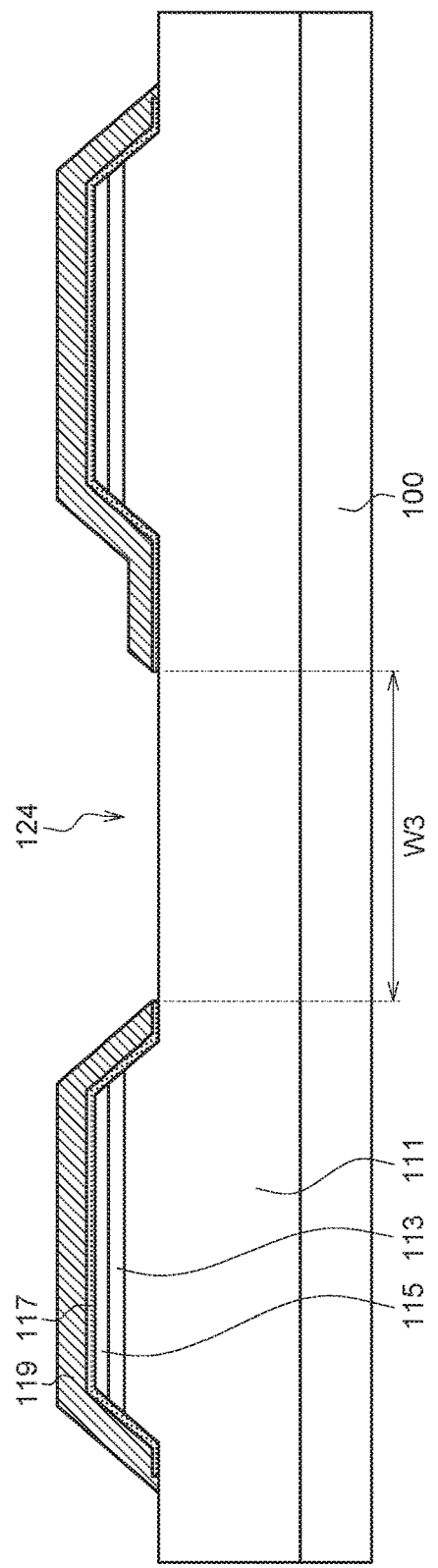
Figure 10B:
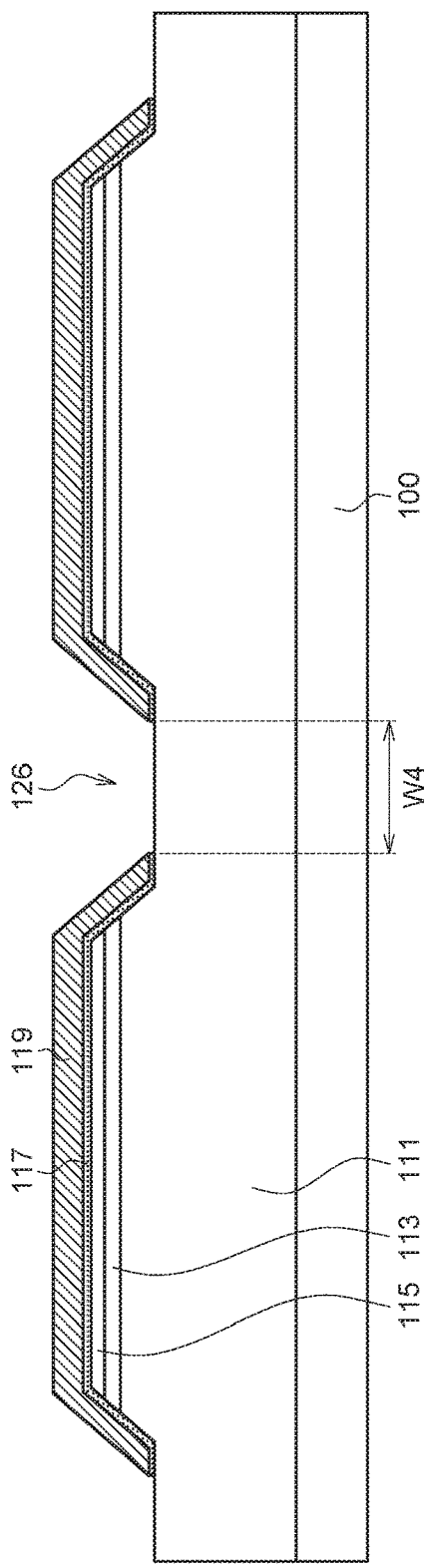

As shown in FIGS. 10A and 10B, a second photoresist layer 119 is formed on the sacrifice layer 117. The second photoresist layer 119 is patterned to form a second patterned photoresist layer 119 covering the sacrifice layer 117 and a portion of the sacrifice layer 117 is exposed. The sacrifice layer 117 is patterned by the second patterned photoresist layer 119. The sacrifice layer 117 is formed in a part of the first opening 124 and the first type semiconductor layer 111 is exposed. The sacrifice layer 117 is formed in a part of the second opening 126 and the first type semiconductor layer 111 is exposed. The first type semiconductor layer 111 has a width W3 exposed in the first opening 124 which is projected to the substrate 100. That is, the width W3 is a width of the first type semiconductor 111 exposed from the sacrifice layer 117 in the first opening 124 which is projected to the substrate 100. The first type semiconductor layer 111 has a width W4 exposed in the second opening 126 which is projected to the substrate 100. That is, the width W4 is a width of the first type semiconductor 111 exposed from the sacrifice layer 117 in the second opening 126 which is projected to the substrate 100. The width W3 is larger than the width W4. The material of the second photoresist layer 119 can be similar to the material of the first photoresist layer 19, and the similarities are not repeated here.

Figure 11B:
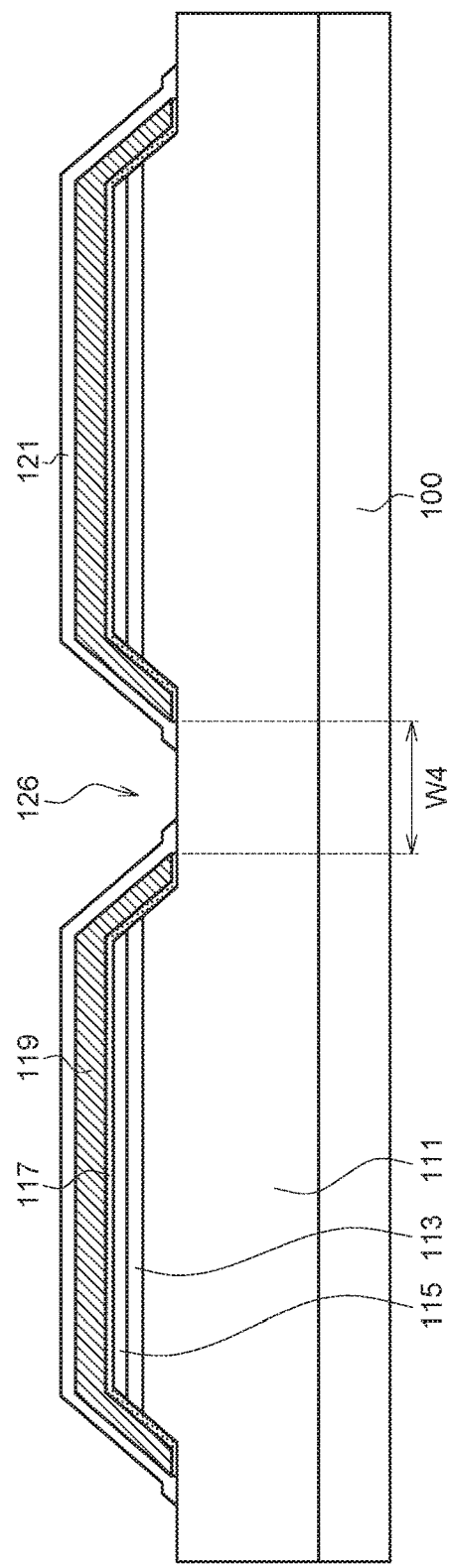

As shown in FIGS. 11A and 11B, a third photoresist layer 121 is formed on the second photoresist layer 119. Or, the third photoresist layer 121 can be formed on the second photoresist layer 119 as shown in FIGS. 10A and 10B. After patterning the third photoresist layer 121, the third patterned photoresist layer 121 is formed to cover the second patterned photoresist layer 119 in the first opening 124 and a portion of the first type semiconductor layer 111, and to cover the sacrifice layer 117 in the second opening 126, and the first type semiconductor layer 111 is exposed. After patterning the third photoresist layer 121, the first type semiconductor layer 111 has a width W5 exposed from the third photoresist layer 121 in the opening 124 which is projected to the substrate 100. The width W5 is smaller than the width W3. The third photoresist layer 121 and the sacrifice layer 117 have different etching rates. In the present embodiment, the etching rate of the sacrifice layer 117 is smaller than that of the photoresist layer 121. The material of the sacrifice layer 117 can be $SiO_2$. The materials of the second photoresist layer 119 and the third photoresist layer 121 can be similar, and the similarities are not repeated here. The sacrifice layer 117 can be formed by Plasma-Enhanced Chemical Vapor Deposition (PECVD) or e-beam gun. The second photoresist layer 119 and the third photoresist layer 121 can be formed by spin coating.

Figure 12A:
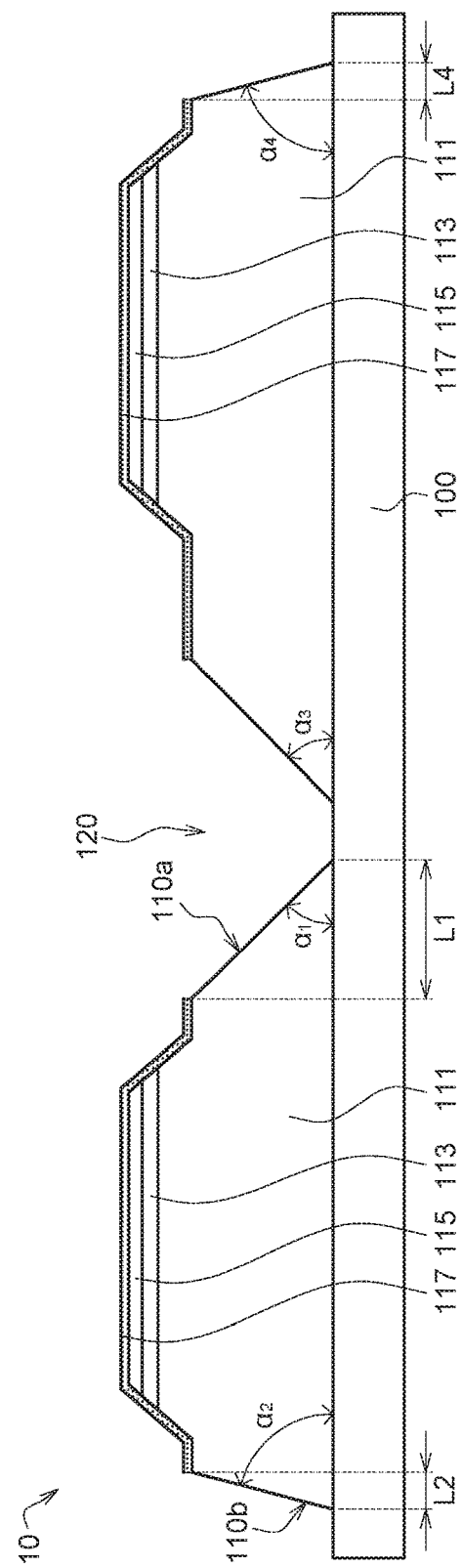
Figure 12B:
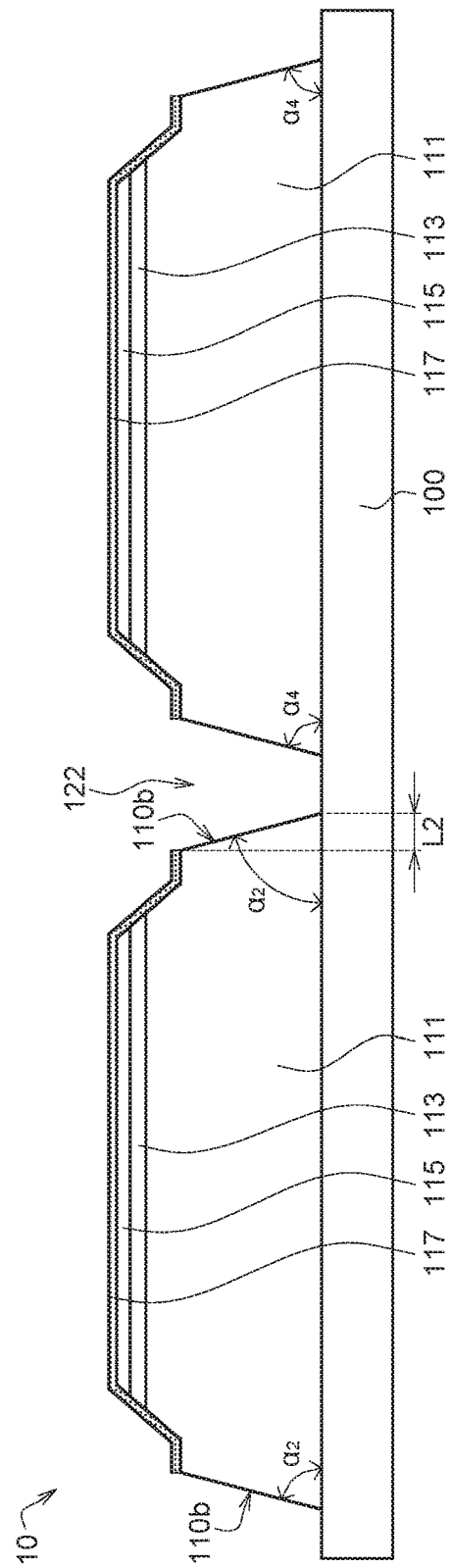
Figure 13B:
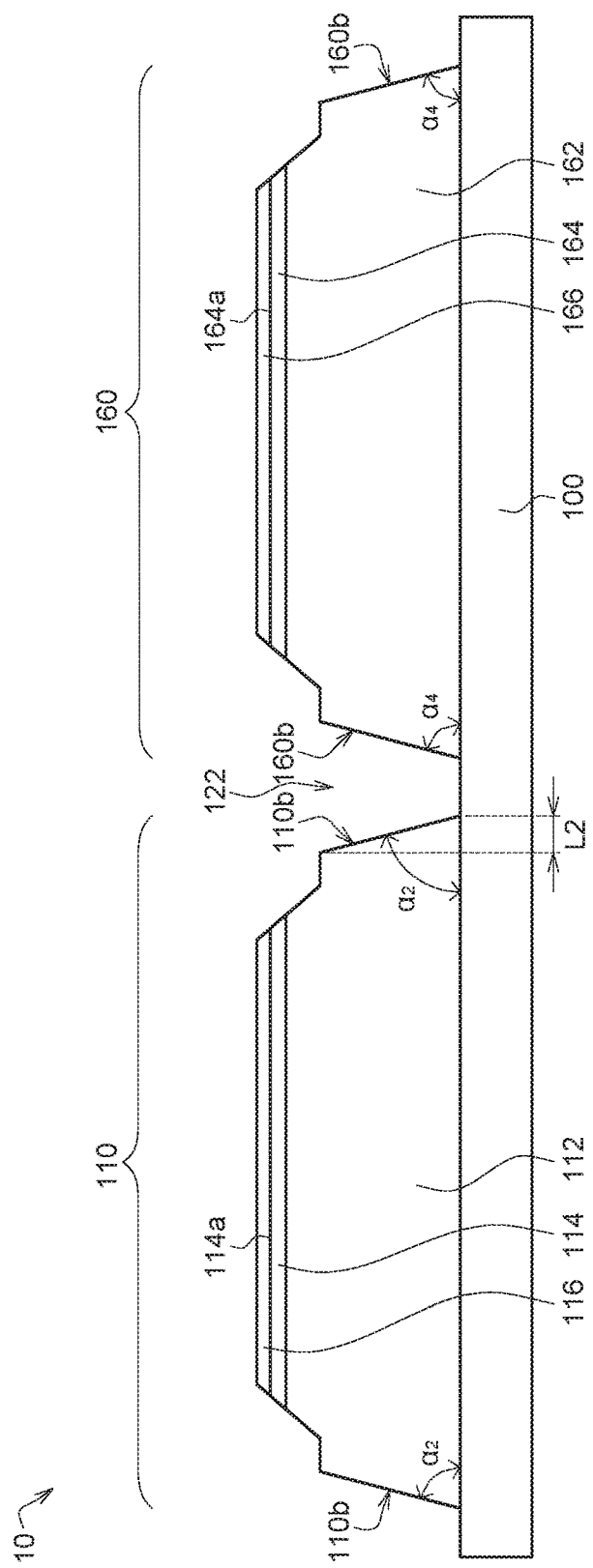

As shown in FIGS. 12A and 12B, the first type semiconductor layer 111 is etched by using second photoresist layer 119, the third photoresist layer 121 and the sacrifice layer 117 as a mask, so that a first recess 120 penetrating through the first type semiconductor layer 111 is formed in the first opening 124, and a second recess 122 penetrating through the first type semiconductor layer 111 is formed in the second opening 126. The first recess 120 has a first sidewall 110a and the second recess 122 has a second sidewall 110b, wherein the first sidewall 110a corresponds to the first sidewall 110a of the first type semiconductor layer 111 as shown in FIG. 12A, and corresponds to the first sidewall 110a of the first semiconductor layer 112 as shown in FIG. 13A. The second sidewall 110b corresponds to the second sidewall 110b of the first type semiconductor layer 111 as shown in FIGS. 12A-12B, and corresponds to the second sidewall 110b of the first semiconductor layer 112 as shown in FIGS. 13A-13B. A first angle $\alpha_1$ is between the first sidewall 110a and the substrate 100. A second angle $\alpha_2$ is between the second sidewall 110b and the substrate 100. The first angle $\alpha_1$ and the second angle $\alpha_2$ can be the acute angle. The first angle $\alpha_1$ is smaller than the second angle $\alpha_2$. A first length L1 of the first sidewall 100a projected to the substrate 100 is larger than a second length L2 of the second sidewall 110b projected to the substrate 100. The maximal width of the first recess 120 is larger than the maximal width of the second recess 122. The substrate 100 is exposed in the first recess 120 and the second recess 122. Besides, the first recess 120 and the second recess 122 can be formed by the Inductively Coupled Plasma method and the Reactive-Ion Etching method.

In the present embodiment, since the etching rate of the sacrifice layer 117 is lower than the etching rate of the third photoresist layer 121, the regions covered by the sacrifice layer 117 also have a lower etching rate than the regions not covered by the sacrifice layer 117 during the etching process, so that the regions in the first opening 124 and the second opening 126 not covered by the sacrifice layer 117 has a higher etching rate. The sidewall of the second recess 122 is steeper than the sidewall of the first recess 120. Besides, since the width W3 of the first type semiconductor layer 111 exposed from the sacrifice layer 117 in the first opening 124 which is projected to the substrate 100 is larger than the width W4 of the first type semiconductor layer 111 exposed from the sacrifice layer 117 in the second opening 126 which is projected to the substrate 100, and the width W5 of the first type semiconductor layer 111 exposed from the third photoresist layer 121 in the first opening 124 which is projected to the substrate 100 is smaller than the width W3, the sidewall of the second recess 122 is steeper than the sidewall of the first recess 120. Therefore, the etched pattern can be controlled by the use of the sacrifice layer 117 and the third photoresist layer 121, so that the first type semiconductor layer 111 protected by the sacrifice layer 117 is not etched easily, and the first sidewall 110a and the second sidewall 110b have different degrees of slope. Thus, the breakage or peeling of the conductive layer can be avoided, and a lager light-emitting area can also be maintained, to improve the performance of the chip.

Referring to FIGS. 13A and 13B, the sacrifice layer 117, the second photoresist layer 119 and the third photoresist layer 121 are removed, and the first light-emitting unit 110 and the second light-emitting unit 160 are formed. The sacrifice layer 117, the second photoresist layer 119 and the third photoresist layer 121 can be removed by wet etching. The etchant of the wet etching is, for example, HF or a Buffered Oxide Etchant (BOE). The first light-emitting unit 110 includes a first semiconductor layer 112, a first light-emitting layer 114 and a second semiconductor layer 116. The first semiconductor layer 112 is disposed on the substrate 100. The first light-emitting layer 114 is disposed between the first semiconductor layer 112 and the second semiconductor layer 116. The second light-emitting unit 160 includes a third semiconductor layer 162, a second light-emitting layer 164 and a fourth semiconductor layer 166. The third semiconductor layer 162 is disposed on the substrate 100. The second light-emitting layer 164 is disposed between the third semiconductor layer 162 and the fourth semiconductor layer 166. A first recess 120 and a second recess 122 are between the first light-emitting unit 110 and the second light-emitting unit 160.

Figure 14:
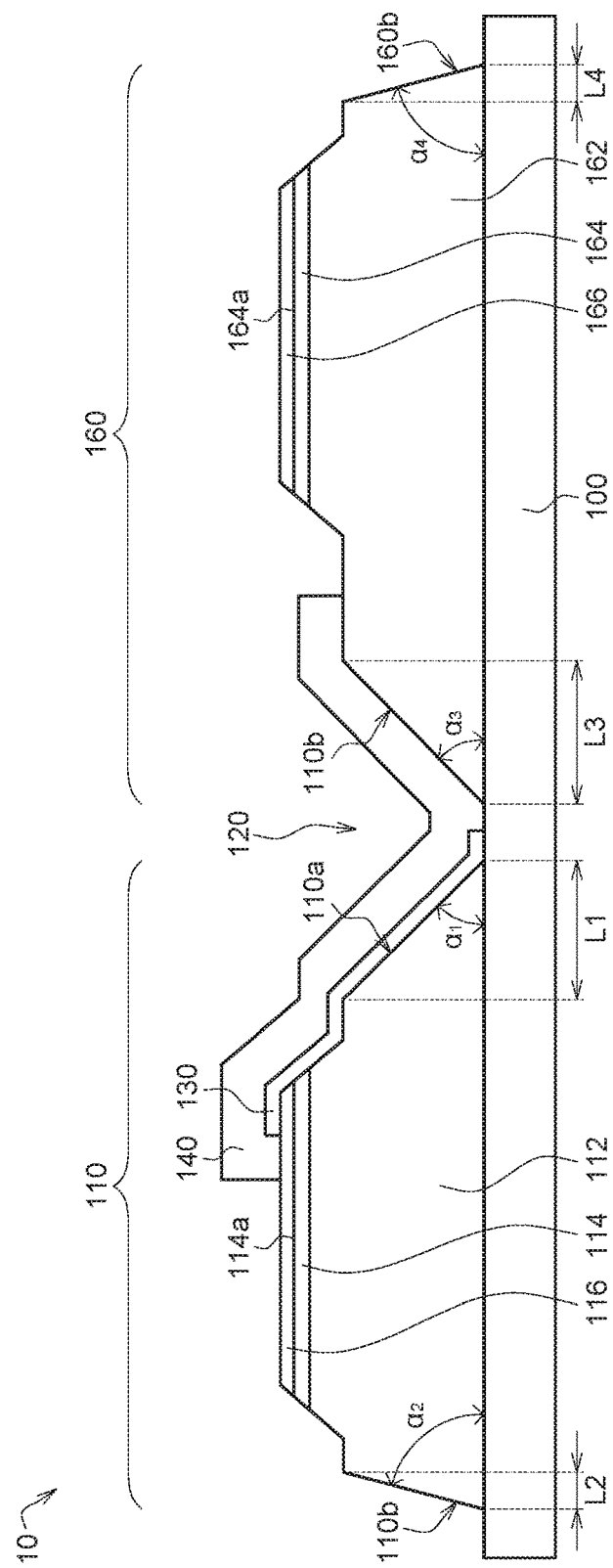

As shown in FIG. 14, an insulating layer 130 covering a portion of the first semiconductor layer 112 (such as covering the first sidewall 110a of the first recess 120) is formed in the first opening 124 and the first recess 120. A conductive layer 140 is formed in the first opening 124 and the first recess 120 to cover the insulating layer 130, so that the conductive layer 140 connects the second semiconductor layer 116 of the first light-emitting unit 110 and the third semiconductor layer 162 of the second light-emitting unit 160. Since the second sidewall 110b of the second recess 122 has neither the insulating layer 130 nor the conductive layer 140, the substrate 100 is exposed from the second recess 122 after forming the insulating layer 130 and the conductive layer 140, and neither the insulating layer 130 nor the conductive layer 140 is formed between the first light-emitting unit 110 and the second light-emitting unit 160, as shown in FIG. 13B.

In the present invention, the light-emitting unit 10 has two adjacent light-emitting units, but the invention is not limited thereto. In other embodiments, as long as the first sidewall of the first recess has a degree of slope different from the second sidewall of the second recess, it can be encompassed in the scope of the invention. For example, the light-emitting device can be formed of more than two light-emitting units connected in series or in parallel.

Figure 15:
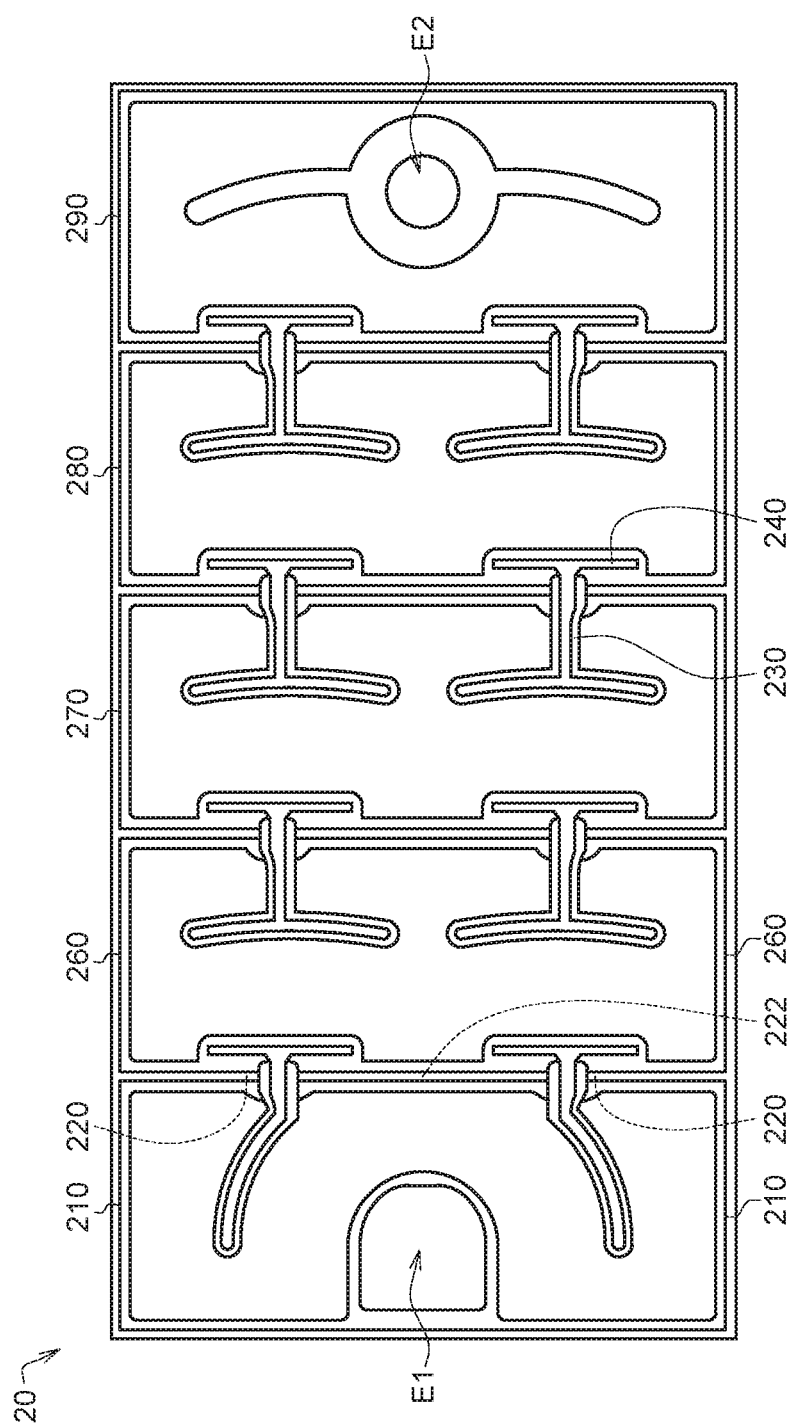
FIG. 15 shows a top view of a light-emitting device according to another embodiment of the invention.

FIG. 15 shows a top view of a light-emitting device 20 according to another embodiment of the invention.

Referring to FIG. 15, the light-emitting device 20 has 5 light-emitting units including a first light-emitting unit 210, a second light-emitting unit 260, a third light-emitting unit 270, a fourth light-emitting unit 280, and a fifth light-emitting unit 290. An electrode E1 is on the first light-emitting unit 210. An electrode E2 is on the fifth light-emitting unit 290. The electrode E1 can be connected to the positive voltage, and the electrode E2 can be connected to the negative voltage. Or, the electrode E1 can be connected to the negative voltage, and the electrode E2 can be connected to the positive voltage. Two first recesses 220 are formed between the first light-emitting unit 210 and the second light-emitting unit 260, the second light-emitting unit 260 and the third light-emitting unit 270, the third light-emitting unit 270 and the fourth light-emitting unit 280, and the fourth light-emitting unit 280 and the fifth light-emitting unit 290, respectively. In other embodiment, only one first recess 220 is between each of the light-emitting units. In the present embodiment, a second recess 222 is formed between the two first recesses 220 or out of the two first recesses 220. The conductive layer 240 is formed on the insulating layer 230, and extends in the first recess 220 to electrically connect the adjacent two light-emitting units. The conductive layer 240 is not disposed in the second recess 222. In the present embodiment, the conductive layers 240 having the same pattern are disposed between each of the light-emitting units to simplify the process.

In sum, during the process for manufacturing the light-emitting device of the present embodiment, the sacrifice layer and the third photoresist layer covering the sacrifice layer can be formed before forming the first recess and the second recess. The third photoresist layer and the sacrifice layer have different etching rates. A width of the first type semiconductor layer exposed from the sacrifice layer in the first opening which is projected to the substrate is larger than a width of the first type semiconductor layer exposed from the sacrifice layer in the second opening which is projected to the substrate. A width of the first type semiconductor layer exposed from the third photoresist layer in the first opening which is projected to the substrate is also smaller than the width of the first type semiconductor layer exposed from the sacrifice layer in the first opening which is projected to the substrate. Accordingly, when the first recess and the second recess are formed, the first sidewall and the second sidewall can have different degrees of slope, wherein the first angle between the first sidewall and the substrate is smaller than the second angle between the second sidewall and the substrate, and a first length of the first sidewall projected to the substrate is larger than a second length of the second sidewall projected to the substrate. Such that, the sidewall having a smaller angle to the substrate can be formed only aiming to the region which has the conductive layer (the first recess). The slope structure having a smaller angle to the substrate is not necessary to be provided for the conductive layer in the region out of the conductive layer (the second recess). Therefore, the second sidewall having a larger angle to the substrate can be formed, and the etched area of the light-emitting device can be reduced, to resolve problems of the shrinkage of the light-emitting area and the increase of the production cost.

In addition, the adhesion capability between the conductive layer and the substrate or the adhesion capability between the conductive layer and the third sidewall is better than the adhesion capability between the conductive layer and the insulating layer. Since the conductive layer is directly in contact with the upper surface of the substrate and the third sidewall in the present light-emitting device, the conductive layer of the present embodiment can have a better adhesion capability and is not peeled off easily, and the holes is not produced easily in the conductive layer to further improve the electrical conductivity in comparison with the conventional light-emitting device.

Therefore, the conductive layer 140 of the present embodiment can have a better adhesion capability and is not peeled off easily, the holes is not produced easily in the conductive layer 140, and the electrical conductivity can further be improved in comparison with the conventional light-emitting device.

While the invention has been described by way of example and in terms of the preferred embodiment(s), it is to be understood that the invention is not limited thereto. It will be apparent to those skilled in the art that various modifications and variations can be made without departing from the spirits and the scope of the present invention. It is intended that the scope of the disclosure is indicated by the following claims.

What is claimed is:

1. A light-emitting device, comprising:
   a substrate;
   a first light-emitting unit (LEU) and a second light-emitting unit (LEU) apart disposed on the substrate and exposing a portion of the substrate therebetween, wherein the first LEU has a first sidewall and a second sidewall and the second LEU has a third sidewall and a fourth sidewall; and
   a conductive bridge layer electrically connecting the first LEU and the second LEU, wherein the conductive bridge layer is continuously disposed on the second sidewall, the exposed portion of the substrate and the third sidewall,
   wherein a slope of the second sidewall is smaller than a slope of the first sidewall.

2. The light-emitting device according to claim 1, further comprising an insulating layer covering the second sidewall and exposing the third side wall, wherein the conductive bridge layer is disposed on the insulating layer on the second sidewall and directly contacts one of a first type semiconductor layer and a second type semiconductor layer of the second LEU on the third sidewall.

3. The light-emitting device according to claim 1, wherein an angle between the second sidewall and the substrate is smaller than 70 degrees.

4. The light-emitting device according to claim 3, wherein the angle between the second sidewall and the substrate is smaller than 50 degrees.

5. The light-emitting device according to claim 1, wherein a slope of the third sidewall is smaller than a slope of the fourth sidewall.

6. The light-emitting device according to claim 5, wherein an angle between the third sidewall and the substrate is smaller than 70 degrees.

7. The light-emitting device according to claim 6, wherein the angle between the third sidewall and the substrate is smaller than 50 degrees.

8. A light-emitting device, comprising:
   a substrate;
   a first light-emitting unit (LEU) and a second light-emitting unit (LEU) apart disposed on the substrate and exposing a portion of the substrate therebetween, wherein the first LEU has a first sidewall and a second sidewall and the second LEU has a third sidewall and a fourth sidewall;
   a conductive bridge layer electrically connecting the first LEU and the second LEU, wherein the conductive bridge layer is continuously disposed on the second sidewall, the exposed portion of the substrate and the third sidewall; and
   an insulating layer covering the second sidewall and exposing the third side wall, wherein the conductive bridge layer is disposed on the insulating layer on the second sidewall and directly contacts one of a first type semiconductor layer and a second type semiconductor layer of the second LEU on the third sidewall.

9. The light-emitting device according to claim 8, wherein an angle between the second sidewall and the substrate is smaller than 70 degrees.

10. The light-emitting device according to claim 9, wherein the angle between the second sidewall and the substrate is smaller than 50 degrees.

11. The light-emitting device according to claim 8, wherein an angle between the third sidewall and the substrate is smaller than 70 degrees.

12. The light-emitting device according to claim 11, wherein the angle between the third sidewall and the substrate is smaller than 50 degrees.

13. The light-emitting device according to claim 8, wherein a slope of the third sidewall is smaller than a slope of the fourth sidewall.

* * * * *